United States Patent
Shao et al.

(10) Patent No.: US 7,132,216 B2
(45) Date of Patent: Nov. 7, 2006

(54) NON-AROMATIC CHROMOPHORES FOR USE IN POLYMER ANTI-REFLECTIVE COATINGS

(75) Inventors: Xie Shao, Rolla, MO (US); Robert Cox, St. James, MO (US); Shreeram V. Deshpande, Rolla, MO (US); Tony D. Flaim, St. James, MO (US); Rama Puligadda, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 10/689,482

(22) Filed: Oct. 20, 2003

(65) Prior Publication Data

US 2004/0067441 A1 Apr. 8, 2004

Related U.S. Application Data

(63) Continuation of application No. 09/961,751, filed on Sep. 24, 2001, now abandoned, which is a continuation of application No. 09/450,966, filed on Nov. 30, 1999, now abandoned.

(51) Int. Cl.
*G03C 1/825* (2006.01)
*G03C 1/83* (2006.01)
*G03C 1/815* (2006.01)
*G03C 1/73* (2006.01)

(52) U.S. Cl. ............... 430/270.1; 430/287.1; 430/288.1; 430/905; 430/907; 430/271.1

(58) Field of Classification Search ......... 430/270.1, 430/286.1, 287.1, 288.1, 905, 907, 271.1
See application file for complete search history.

(56) References Cited

U.S. PATENT DOCUMENTS

| 4,307,184 | A | * | 12/1981 | Beretta et al. | 430/512 |
|---|---|---|---|---|---|
| 4,388,448 | A | | 6/1983 | Melby | 525/327.3 |
| 4,443,534 | A | * | 4/1984 | Kojima et al. | 430/512 |
| 4,719,166 | A | | 1/1988 | Blevins et al. | 430/270.1 |
| 5,187,048 | A | * | 2/1993 | Woods et al. | 430/286.1 |
| 5,576,144 | A | | 11/1996 | Pearce et al. | 430/270.1 |
| 5,759,755 | A | | 6/1998 | Park et al. | 430/512 |
| 5,919,599 | A | | 7/1999 | Meador et al. | 430/271.1 |
| 6,156,479 | A | | 12/2000 | Meador et al. | 430/270.1 |
| 6,346,361 | B1 | * | 2/2002 | Shan et al. | 430/168 |
| 2004/0249099 | A1 | * | 12/2004 | Kotzev | 526/320 |

FOREIGN PATENT DOCUMENTS

| EP | 0357110 A1 | | 7/1990 |
|---|---|---|---|
| JP | 63-56651 | * | 3/1988 |

OTHER PUBLICATIONS

Chemical Abstract 1988:6109 (Angeletti et al, "Gas-liquid phase-transfer catalysis. Wittig-Horner reaction in heterogeneous conditions", Journal of the Chemical Society, Perkin Transactions 1: Organic and Bio-Organic Chemistry (1972-1999) (1987), (4), p. 713-14).*
Chem. Abstract 1988:619489—English abstract for JP 63-56651 (Usagawa et al).*

* cited by examiner

*Primary Examiner*—Sin Lee
(74) *Attorney, Agent, or Firm*—Hovey Williams LLP

(57) ABSTRACT

An improved light attenuating compound for use in the production of microdevices is provided. Broadly, the light attenuating compound is non-aromatic and can be directly incorporated (either physically or chemically) into photolithographic compositions such as bottom anti-reflective coatings (BARC) and contact or via hole fill materials. The preferred non-aromatic compounds of the invention are conjugated aliphatic and alicyclic compounds which greatly enhance the plasma etch rate of the composition. Furthermore, the light attenuating compounds are useful for absorbing light at shorter wavelengths. In one embodiment, the inventive compounds can be polymerized so as to serve as both the polymer binder of the composition as well as the light absorbing constituent.

9 Claims, No Drawings

NON-AROMATIC CHROMOPHORES FOR USE IN POLYMER ANTI-REFLECTIVE COATINGS

RELATED APPLICATION

This application is a continuation of U.S. patent application Ser. No. 09/961,751 filed Sep. 24, 2001, now abandoned which is a continuation of U.S. patent application Ser. No. 09/450,966 filed Nov. 30, 1999, now abandoned. Each of U.S. patent application Ser. Nos. 09/961,751 and 09/450,966 is incorporated by reference herein.

BACKGROUND OF THE INVENTION

1. Field of the Invention

The present invention is broadly concerned with light attenuating compounds for incorporation into photolithographic compositions (e.g., anti-reflective coatings and contact or via hole fill compositions) utilized in the manufacturing of microdevices. More particularly, the light attenuating compounds are non-aromatic and are especially useful for absorbing light at shorter wavelengths (e.g., 248 nm). The compounds can be physically incorporated into the particular composition, or alternately, can be chemically bonded to a polymer binder already present in the composition. The compounds of the invention comprise conjugated aliphatic and alicyclic moieties which meet the necessary light absorbency requirements for the composition while enhancing the plasma etch rate of the composition when compared to prior art aromatic dyes.

2. Description of the Prior Art

A frequent problem encountered by photoresists during the manufacturing of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is non-planar and/or highly reflective. One approach to address this problem is the incorporation of an anti-reflective dye either into the photoresist layer, into a contact or via hole fill composition, into a bottom anti-reflective coating (BARC), or as a separate layer adjacent the photoresist layer.

Prior art BARC compositions usually contain aromatic anti-reflective dyes which attenuate light that would otherwise reflect from the substrate during photoresist exposure. For example, anthracene and naphthalene derivatives are typically the preferred dyes for use at 248 nm exposing wavelengths. Dyes comprising a benzene ring with at least one conjugated substituent are widely used in BARC's which operate at 365 nm, while dyes comprising a benzene ring without conjugated substituents have ample absorptivity to satisfy most 193 nm applications.

Aromatic dyes have been preferred for BARC applications because of their high light absorbency per unit mass as well as their wide availability, easy preparation, and high chemical stability. While aromatic dyes are useful for achieving high film optical density, they limit the plasma etch rate of the BARC compositions by virtue of their chemical stability. Aromatic dyes require considerably more energy for decomposition than do the polymer binders (which are typically non-aromatic) used in the BARC compositions. As a result, the composite etch rate is highly dependent on the aromatic character of the dyes.

U.S. Pat. No. 4,719,166 to Blevins et al. discloses the use of certain butadienyl dyes in a photoresist layer, an anti-reflective layer, or a planarizing layer for protecting photoresist elements against reflection of activating radiation from the substrate. However, the dyes of the '166 patent are not attached to the backbone of a polymer binder, thus permitting them to readily solubilize in the photoresist, often leading to pattern degradation. Furthermore, current technology continues to require increasingly complex circuitry be imprinted on chips of decreasing size. These smaller chips require shorter wavelengths (e.g., 248 nm) be used during photoresist exposure. The dyes of the '166 patent are useful for absorbing light only at 365 nm exposure wavelengths, making them unsuitable for use in the manufacturing of most current microdevices.

There is a need for a compound which can effectively attenuate light at shorter wavelengths and which does not inhibit the etch rate of the particular BARC or contact or via hole fill composition in which it is utilized.

SUMMARY OF THE INVENTION

The present invention fills this need by providing light attenuating compounds for BARC compositions, contact or via hole fill compositions, and other microdevice manufacturing compositions which do not inhibit the etch rate of the composition. Furthermore, the inventive compounds are useful for absorbing light at shorter wavelengths.

In more detail, the light attenuating compounds are non-aromatic and can be formulated to absorb light at the desired wavelength. Advantageously, the compounds are also useful for absorbing light at wavelengths of less than about 300 nm, and preferably less than about 250 nm (e.g., for 248 nm applications).

As used herein, non-aromatic refers to compounds or moieties of compounds which either:

(1) do not include a benzene ring; or
(2) (a) have non-planar carbon skeletons; and
   (b) do not contain (4n+2) π electrons, where n=0, 1, 2, 3, etc. (i.e., do not obey Hückel's Rule as described in Solomons, T. W. Graham, *Fundamentals of Organic Chemistry*, 3rd ed., John Wiley & Sons, Inc. (1990)).

The light attenuating compounds of the invention comprise moieties having general structural formulas (set forth in detail below). Preferably, these compounds include one or more reactive groups selected from the group consisting of COOH, OH, CONH$_2$, CONHR, CH$_2$X groups, and mixtures thereof, where R is selected from the group consisting of hydrogen, alkyls (preferably C$_1$–C$_4$ branched and unbranched), and heteroalkyls, and X is a halogen.

The light attenuating compounds can be incorporated into the particular photolithographic composition either physically (i.e., as a mixture) or by chemically attaching the light attenuating compound to the polymer binder or resin present in the composition (either to a functional group on the binder or directly to the backbone of the binder). In situations where the light attenuating compound is attached to the polymer binder, a linkage unit can be used as an intermediate for securing the light attenuating compound to the binder. That is, the light attenuating compound can be attached to a linkage unit which in turn is attached to the polymer binder (either to a functional group on the binder or to the binder backbone). Examples of suitable linkage units are those which comprise a moiety selected from the group consisting of alkyls (preferably C$_1$–C$_4$ branched and unbranched), acyclic heteroalkyls, non-aromatic cyclic alkyls (preferably C$_3$–C$_6$) and non-aromatic cyclic heteroalkyls.

In another embodiment, the light attenuating compounds can be polymerized alone so as to directly form the polymer binder utilized in the particular photolithographic composition while simultaneously acting as a light absorber. Thus, in these applications an additional polymer binder would not be necessary.

In applications where a polymer binder other than the light attenuating compound is present in the composition, the binder should be dissolved in a solvent system (either single or multiple solvents). The particular polymer binders and solvent systems utilized are readily ascertainable by those skilled in the art. Examples of suitable polymer binders include polyesters, polyacrylates, polyheterocyclics, polyetherketones, polyhydroxystyrene, polycarbonates, polyepichlorohydrin, polyvinyl alcohol, oligomeric resins (such as crown ethers, cyclodextrins, epoxy resins), and mixtures of the foregoing. Examples of preferred solvents for use in the solvent system include alcohols, ethers, glycol ethers, amides, esters, ketones, water, propylene glycol monomethyl ether (PGME), propylene glycol monomethyl ether acetate (PGMEA), ethyl lactate, and PCBTF (p-chlorobenzotrifluoride).

Incorporating light attenuating compounds into photolithographic compositions in accordance with the invention will not increase the etch rate of the composition as is the case with prior art compositions comprising aromatic dyes. Thus, when practicing the instant invention, the etch rate of the photolithographic composition will be at least about 4000 Å/minute, where a mixture of HBr and $O_2$ is the etchant gas.

DETAILED DESCRIPTION OF THE PREFERRED EMBODIMENTS

While the inventive light attenuating compounds broadly include non-aromatic dyes, and particularly non-aromatic dyes which absorb light at shorter wavelengths, in preferred embodiments the compounds include one or more of the following moieties.

Generally speaking, the light attenuating compounds should include at least one double bond in conjugation with at least one electron-withdrawing group (EWG). One such structure is shown below in Formula I.

Formula I:

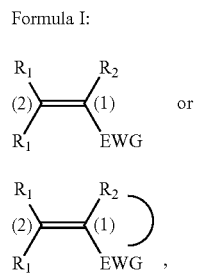

Structure A

Structure B where:
each $R_1$ is non-aromatic and may individually be hydrogen, or an acyclic (preferably $C_1$–$C_4$ branched or unbranched) or cyclic (preferably $C_5$–$C_6$) alkyl or heteroalkyl;
in structure A, where EWG and $R_2$ do not form a cyclic unit:
EWG is a non-aromatic electron-withdrawing group such as a carbonyl, cyano, imino, carboxylic acid, carboxylic ester, carboxamido, carboximido, or sulfonyl group; and $R_2$ is non-aromatic and may be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group;

in structure B, where EWG and $R_2$ form a cyclic electron-withdrawing unit, the cyclic unit preferably comprises a C=O, C=S, or a C=N at a first carbon atom, and:
a C=O or a C=N attached to a carbon atom at least two carbon atoms away from the first carbon atom; or
an O, S, or N as a member of the ring at least two positions away from the first carbon atom; and (1) and (2) refer to the respective double-bonded carbon atoms.

Examples of particularly preferred structures B of Formula I where EWG and $R_2$ form a cyclic electron-withdrawing unit include the following:

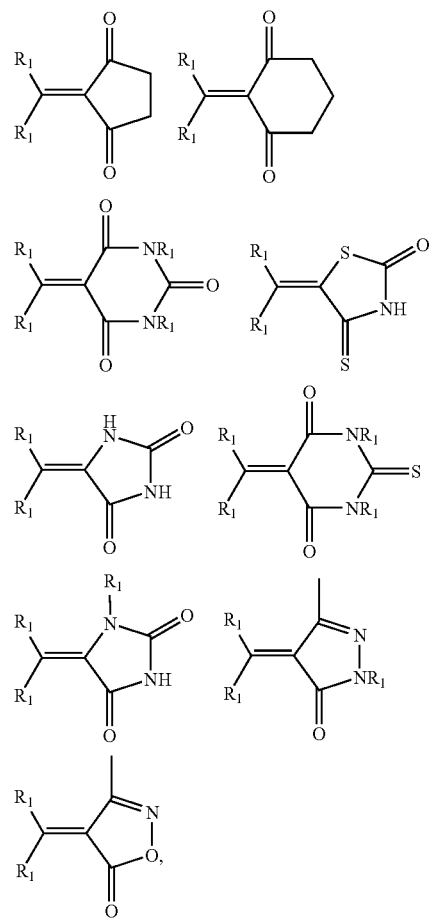

where $R_1$ is non-aromatic and may individually be hydrogen, or an acrylic (preferably $C_1$–$C_4$ branched or unbranched) or cyclic (preferably $C_5$–$C_6$) alkyl or heteroalkyl.

In another embodiment, the light attenuating compounds include at least one EWG across a double bond from an electron donating group (EDG) as shown in Formula II.

Formula II:

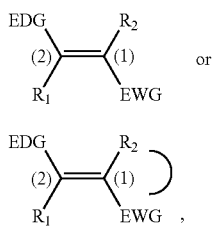

Structure A

Structure B where:
- $R_1$ is non-aromatic and may individually be hydrogen, or an acyclic (preferably $C_1$–$C_4$ branched or unbranched) or cyclic (preferably $C_5$–$C_6$) alkyl or heteroalkyl;
- EDG is an electron-donating group such as $H_3CO$—, —OH, or $R_xR_yN$—, where each of $R_x$ and $R_y$ is non-aromatic and may individually be hydrogen, or an acyclic (preferably $C_1$–$C_2$) or cyclic (preferably $C_5$–$C_6$) alkyl or heteroalkyl;
- in structure A, where EWG and $R_2$ do not form a cyclic unit:
  - EWG is a non-aromatic electron-withdrawing group such as a carbonyl, cyano, imino, carboxylic acid, carboxylic ester, carboxamido, carboximido, or sulfonyl group; and
  - $R_2$ is non-aromatic and may be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group;
- in structure B, where EWG and $R_2$ form a cyclic electron-withdrawing unit, the cyclic unit preferably comprises a C=O, C=S, or C=N at a first carbon atom, and:
  - a C=O or a C=N attached to a carbon atom at least two carbon atoms away from the first carbon atom; or
  - an O, S, or N as a member of the ring at least two positions away from the first carbon atom; and
- (1) and (2) refer to the respective double-bonded carbon atoms.

Examples of particularly preferred structures B of Formula II where EWG and $R_2$ form a cyclic electron-withdrawing unit include the following:

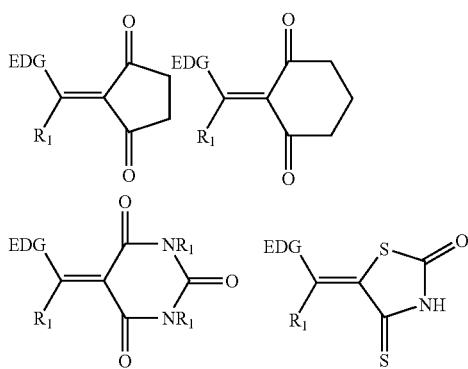

-continued

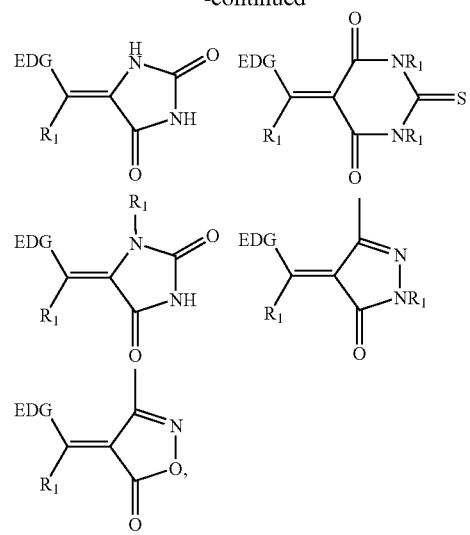

where $R_1$ is non-aromatic and may individually be hydrogen, or an acyclic (preferably $C_1$–$C_4$ branched or unbranched) or cyclic (preferably $C_5$–$C_6$) alkyl or heteroalkyl.

In another embodiment, the light attenuating compounds include two conjugated double bonds in series with at least one EWG (see Formula III) or with two EWG's (see Formula IV). The structures shown in Formulas III and IV are particularly useful at 248 nm or 365 nm wavelength applications, depending upon the selection of R and EWG.

Formula III:

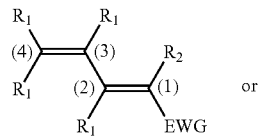

Structure A

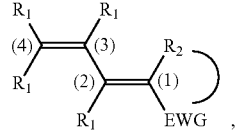

Structure B where:
- each $R_1$ is non-aromatic and may individually be hydrogen, or an acyclic (preferably $C_1$–$C_4$ branched or unbranched) or cyclic (preferably $C_5$–$C_6$) alkyl or heteroalkyl;
- in structure A, where EWG and $R_2$ do not form a cyclic unit:
  - EWG is a non-aromatic electron-withdrawing group such as a carbonyl, cyano, imino, carboxylic acid, carboxylic ester, carboxamido, carboximido, or sulfonyl group; and
  - $R_2$ is non-aromatic and may be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group;

in structure B, where EWG and $R_2$ form a cyclic electron-withdrawing unit, the cyclic unit preferably comprises a C=O, C=S, or a C=N at a first carbon atom, and: a C=O or a C=N attached to a carbon atom at least two carbon atoms away from the first carbon atom; or an O, S, or N as a member of the ring at least two positions away from the first carbon atom; and (1)–(4) refer to the respective double-bonded carbon atoms.

Examples of particularly preferred structures B of Formula III where EWG and $R_2$ form a cyclic electron-withdrawing unit include the following:

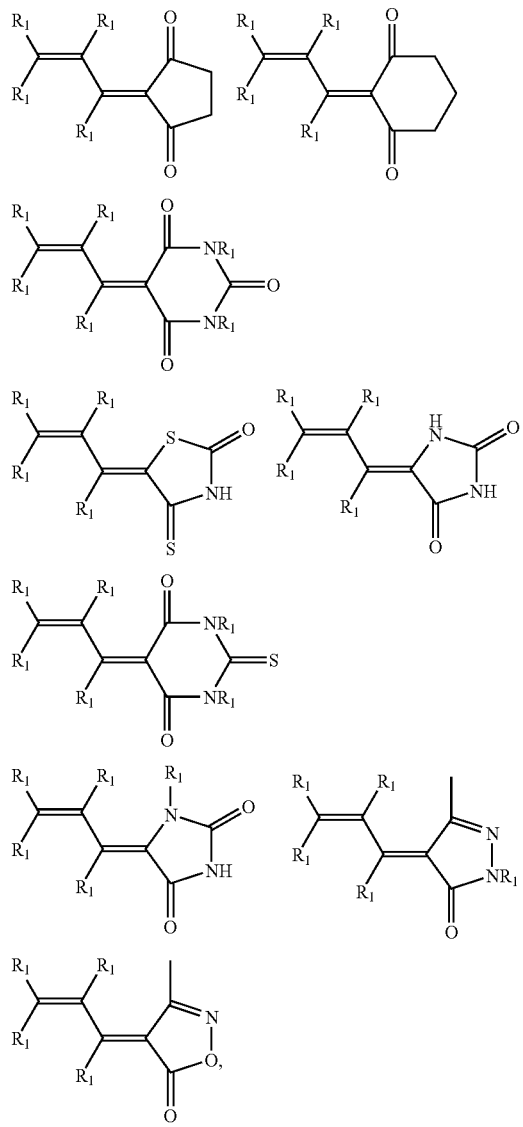

where $R_1$ is non-aromatic and may individually be hydrogen, or an acyclic (preferably $C_1$–$C_4$ branched or unbranched) or cyclic (preferably $C_5$–$C_6$) alkyl or heteroalkyl.

Formula IV:

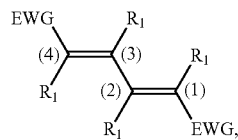

where:

each $R_1$ is non-aromatic and may individually be hydrogen, or an acyclic (preferably $C_1$–$C_4$ branched or unbranched) or cyclic (preferably $C_5$–$C_6$) alkyl or heteroalkyl;

EWG is a non-aromatic electron-withdrawing group such as a carbonyl, cyano, imino, carboxylic acid, carboxylic ester, carboxamido, carboximido, or sulfonyl group; and (1)–(4) refer to the respective double-bonded carbon atoms.

In another embodiment the light attenuating compounds include an EWG coupled with an EDG across a conjugated double bond system. An example of this structure is shown in Formula V.

Formula V:

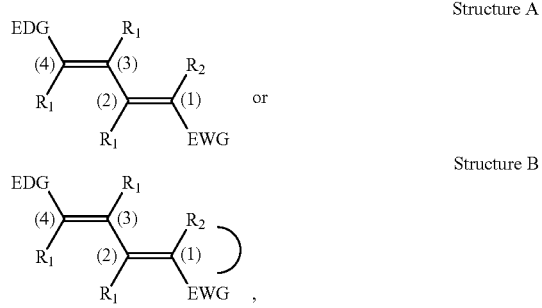

where:

each $R_1$ is non-aromatic and may individually be hydrogen, or an acyclic (preferably $C_1$–$C_4$ branched or unbranched) or cyclic (preferably $C_5$–$C_6$) alkyl or heteroalkyl;

EDG is an electron-donating group such as $H_3CO$—, —OH, or $R_xR_yN$—, where each of $R_x$ and $R_y$ is non-aromatic and may individually be hydrogen, or an acyclic (preferably $C_1$–$C_2$) or cyclic (preferably $C_5$–$C_6$) alkyl or heteroalkyl;

in structure A, where EWG and $R_2$ do not form a cyclic unit:

EWG is a non-aromatic electron-withdrawing group (other than cyano groups) such as a carbonyl, imino, carboxylic acid, carboxylic ester, carboxamido, carboximido, or sulfonyl group, and $R_2$ is non-aromatic and may be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group; or EWG is a cyano group, and $R_2$ is non-aromatic and may be hydrogen, or an acyclic (preferably $C_1$–$C_4$ branched or unbranched) or cyclic (preferably $C_5$–$C_6$) alkyl or heteroalkyl;

in structure B, where EWG and $R_2$ form a cyclic electron-withdrawing unit, the cyclic unit preferably comprises a C=O, C=S, or a C=N at a first carbon atom, and: a C=O or a C=N attached to a carbon atom at least two carbon atoms away from the first carbon atom; or an O, S, or N as a member of the ring at least two positions away from the first carbon atom; and (1)–(4) refer to the respective double-bonded carbon atoms.

Examples of particularly preferred structures B of Formula V where EWG and $R_2$ form a cyclic electron-withdrawing unit include the following:

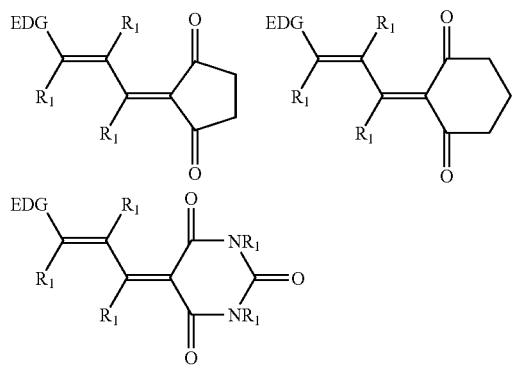

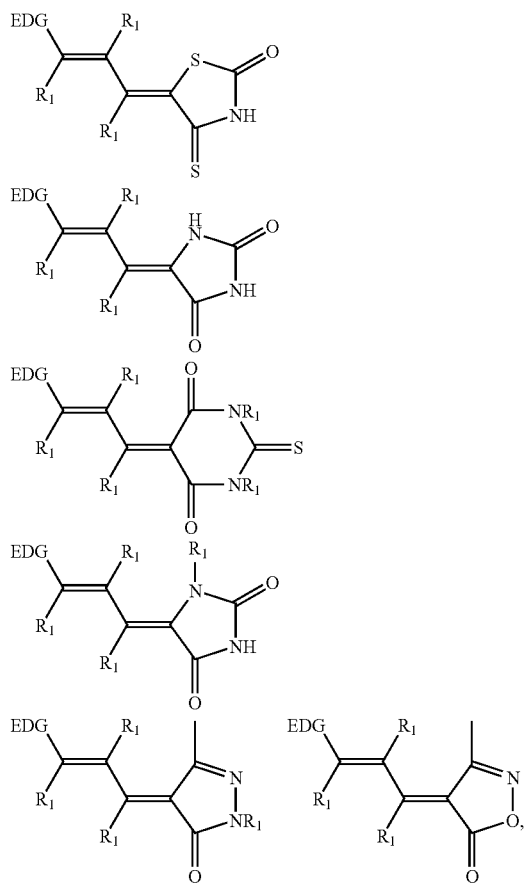

where $R_1$ is non-aromatic and may individually be hydrogen, or an acyclic (preferably $C_1$–$C_4$ branched or unbranched) or cyclic (preferably $C_5$–$C_6$) alkyl or heteroalkyl.

Of course, those skilled in the art will appreciate that light attenuating compounds in accordance with the invention can include mixtures of the foregoing Formulas I–V in the particular photolithographic composition.

In another embodiment, the foregoing structures can be dimerized to form new compositions which are preferably incorporated into photolithographic compositions to absorb light, thus minimizing or eliminating the reflectance from the substrate. These dimerized structures are shown in Formulas VI–VIII.

Formula VI:

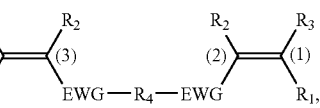

where:

each $R_1$ is non-aromatic and may individually be hydrogen, or an acyclic (preferably $C_1$–$C_4$ branched or unbranched) or cyclic (preferably $C_5$–$C_6$) alkyl or heteroalkyl;

each $R_3$ may individually be $R_1$ or

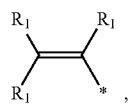

where each $R_1$ is non-aromatic and may individually be hydrogen, or an acyclic (preferably $C_1$–$C_4$ branched or unbranched) or cyclic (preferably $C_5$–$C_6$) alkyl or heteroalkyl, and where the (*) represents the double-bonded carbon atom (1) or (4);

each EWG is a non-aromatic electron-withdrawing group such as a carbonyl, cyano, imino, carboxylic acid, carboxylic ester, carboxamido, carboximido, or sulfonyl group;

each $R_2$ is non-aromatic and may individually be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group;

$R_4$ is a divalent, non-aromatic-containing bridging group such as —(CH$_2$)$_n$—, dimethylenecyclohexyl (—CH$_2$—C$_6$H$_4$—CH$_2$—), —CH$_2$CH$_2$—O—CH$_2$CH$_2$—, or other acyclic (preferably $C_1$–$C_4$, branched or unbranched) or cyclic (preferably $C_5$–$C_6$) alkyls or heteroalkyls; and (1)–(4) refer to the respective double-bonded carbon atoms.

Formula VII:

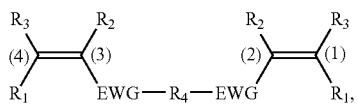

where:
each $R_1$ is non-aromatic and may individually be hydrogen, or an acyclic (preferably $C_1$–$C_4$ branched or unbranched) or cyclic (preferably $C_5$–$C_6$) alkyl or heteroalkyl;
each $R_2$ is non-aromatic and may individually be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group;
each $R_3$ may individually be EDG, or

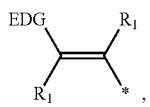

where each $R_1$ is non-aromatic and may individually be hydrogen, or an acyclic (preferably $C_1$–$C_4$ branched or unbranched) or cyclic (preferably $C_5$–$C_6$) alkyl or heteroalkyl;
EDG is an electron-donating group such as $H_3CO$—, —OH, or $R_xR_yN$—, where each of $R_x$ and $R_y$ is non-aromatic and may individually be hydrogen, or an acyclic (preferably $C_1$–$C_2$) or cyclic (preferably $C_5$–$C_6$) alkyl or heteroalkyl;
and where the (*) represents the double-bonded carbon atom (1) or (4);
$R_4$ is a divalent, non-aromatic-containing bridging group such as —$(CH_2)_n$—, dimethylenecyclohexyl (—$CH_2$—$C_6H_4$—$CH_2$—), —$CH_2CH_2$—O—$CH_2CH_2$—, or other acyclic (preferably $C_1$–$C_4$, branched or unbranched) or cyclic (preferably $C_5$–$C_6$) alkyls or heteroalkyls;
each EWG is a non-aromatic electron-withdrawing group such as a carbonyl, cyano, imino, carboxylic acid, carboxylic ester, carboxamido, carboximido, or sulfonyl group; and
(1)–(4) refer to the respective double-bonded carbon atoms.

Formula VIII:

Structure A

Structure B

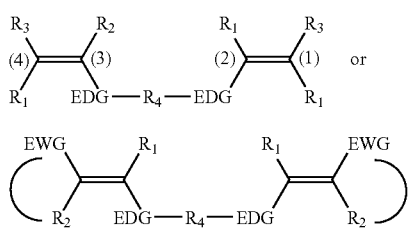

where:
each $R_1$ is non-aromatic and may individually be hydrogen, or an acyclic (preferably $C_1$–$C_4$ branched or unbranched) or cyclic (preferably $C_5$–$C_6$) alkyl or heteroalkyl;
where each $R_3$ may individually be an EWG, Structure C

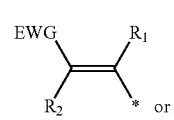

or

Structure D

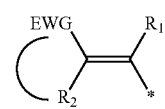

in structure A of Formula VIII, in situations where $R_3$ is an EWG or structure C (i.e., EWG and $R_2$ do not form a cyclic unit):
each EWG is a non-aromatic electron-withdrawing group (other than cyano groups) such as a carbonyl, imino, carboxylic acid, carboxylic ester, carboxamido, carboximido, or sulfonyl group, and each $R_2$ is non-aromatic and may individually be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, carboxylic acid, carboxylic ester, carboxamido, carboximido, or sulfonyl group; or
EWG is a cyano group, and each $R_2$ is non-aromatic and may individually be hydrogen, or an acyclic (preferably $C_1$–$C_4$ branched or unbranched) or cyclic (preferably $C_5$–$C_6$) alkyl or heteroalkyl;
in structure B of Formula VIII, and in structure A of Formula VIII where $R_3$ is structure D (i.e., in situations where EWG and $R_2$ form a cyclic electron-withdrawing unit), the cyclic unit preferably comprises a C=O, C=S, or a C=N at a first carbon atom, and: a C=O or a C=N attached to a carbon atom at least two carbon atoms away from the first carbon atom; or an O, S, or N as a member of the ring at least two positions away from the first carbon atom; and
each EDG is an electron-donating group such as —O—, —S—, or
—$R_5N$—, where $R_5$ is hydrogen or an acyclic (preferably $C_1$–$C_2$) or cyclic (preferably $C_5$–$C_6$) alkyl or heteroalkyl;
$R_4$ is a divalent, non-aromatic-containing bridging group such as —$(CH_2)_n$—, dimethylenecyclohexyl (—$CH_2$—$C_6H_4$—$CH_2$—), —$CH_2CH_2$—O—$CH_2CH_2$—, or other acyclic (preferably $C_1$–$C_4$, branched or unbranched) or cyclic (preferably $C_5$–$C_6$) alkyls or heteroalkyls; and
(1)–(4) refer to the respective double-bonded carbon atoms.

Examples of particularly preferred structures A of Formula VIII where $R_3$ is structure D (i.e., so that EWG and $R_2$ form a cyclic electron-withdrawing unit) include the following:

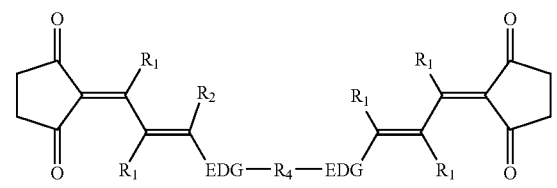
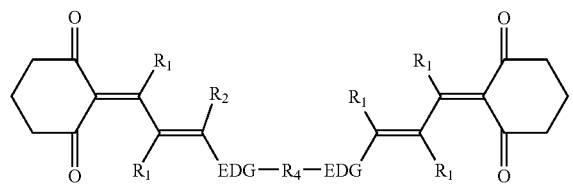
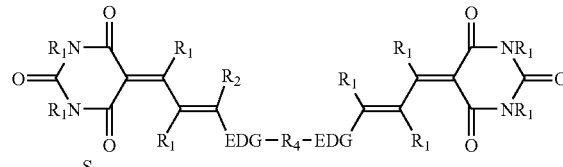
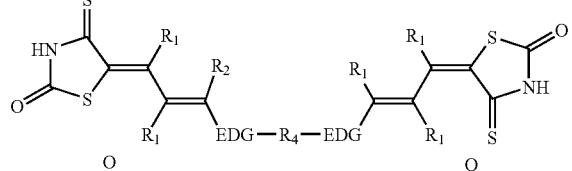
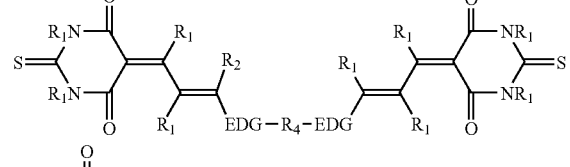
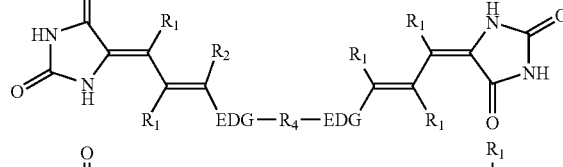
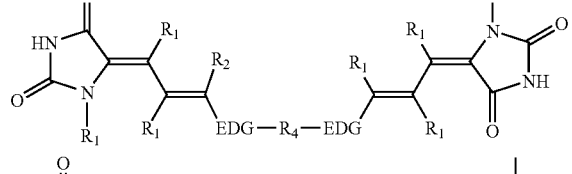
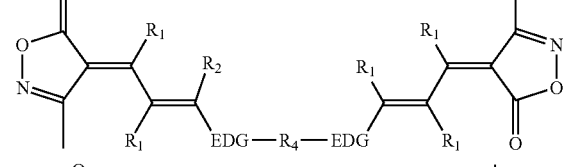
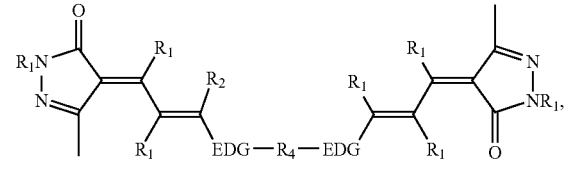

where each $R_1$ is non-aromatic and may individually be hydrogen, an acyclic (preferably $C_1$–$C_4$ branched or unbranched) or cyclic (preferably $C_5$–$C_6$) alkyl or heteroalkyl, and each $R_2$ is non-aromatic and may individually be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, carboxylic acid, carboxylic ester, carboxamido, carboximido, or sulfonyl group.

Examples of particularly preferred structures B of Formula VIII where EWG and $R_2$ form a cyclic electron-withdrawing unit include the following:

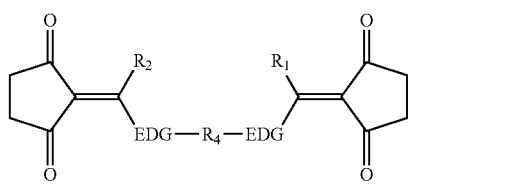
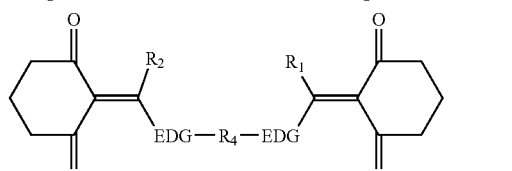
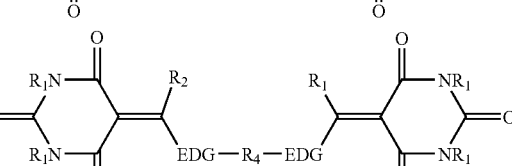
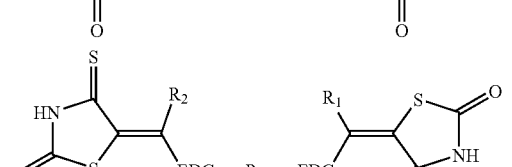
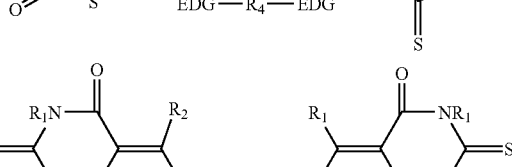
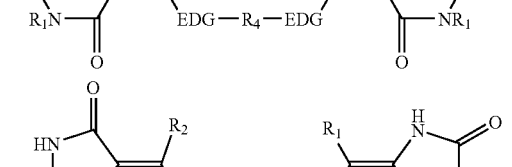
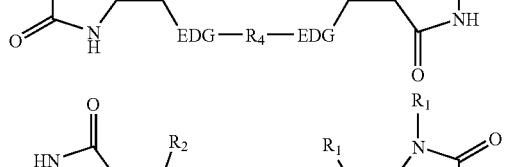
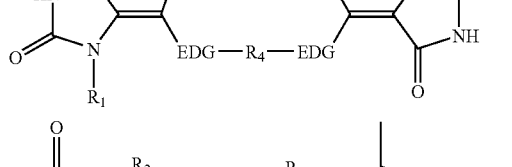
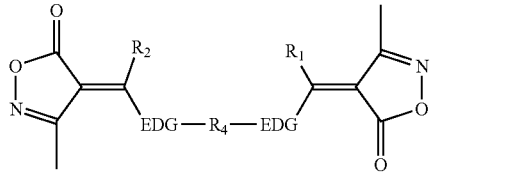

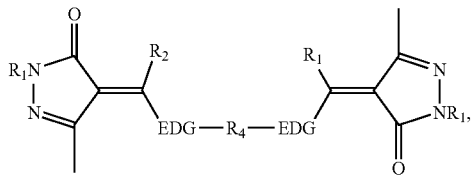 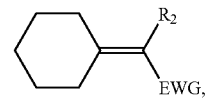

where $R_1$ is non-aromatic and may individually be hydrogen, acyclic (preferably $C_1$–$C_4$ branched or unbranched) or cyclic (preferably $C_5$–$C_6$) alkyl or heteroalkyl, and each $R_2$ is non-aromatic and may individually be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, carboxylic acid, carboxylic ester, carboxamido, carboximido, or sulfonyl group.

In another embodiment, a light attenuating compound is attached to a polymer binder (either directly to the backbone or via a linkage unit) via an EWG. A specific example of one such structure is shown in Formula IX.

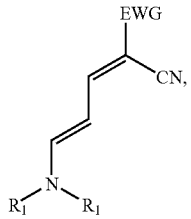

Formula IX where EWG is a non-aromatic electron-withdrawing group such as a carbonyl, cyano, imino, carboxylic acid, carboxylic ester, carboxamido, carboximido, or sulfonyl group, and each $R_1$ may individually be hydrogen or an alkyl group (and preferably a methyl group).

One preferred structure of Formula IX wherein the EWG (a carboxyl group) is directly attached to a polymer backbone as shown below.

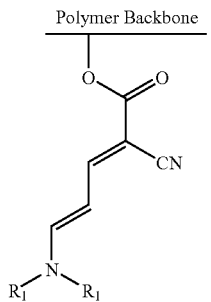

In another embodiment, two $R_1$ substituents on a moiety of the light attenuating compound form a cyclic structure such as those shown in Formulas X and XI.

Formula X where: $R_2$ is non-aromatic and may individually be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group; and EWG is a non-aromatic electron-withdrawing group such as a carbonyl, cyano, imino, carboxylic acid, carboxylic ester, carboxamido, carboximido, or sulfonyl group.

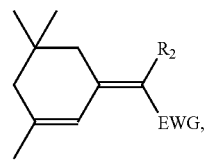

Formula XI where: $R_2$ is non-aromatic and may individually be hydrogen, an acyclic (preferably $C_1$–$C_4$ branched or unbranched) or cyclic (preferably $C_5$–$C_6$) alkyl or heteroalkyl, or an electron-withdrawing group such as a carbonyl, imino, cyano, carboxylic acid, carboxylic ester, carboxamido, carboximido, or sulfonyl group; and EWG is a non-aromatic electron-withdrawing group such as a carbonyl, cyano, imino, carboxylic acid, carboxylic ester, carboxamido, carboximido, or sulfonyl group.

In yet another embodiment, the disclosed Formulas can be joined to one another to form a polymeric structure for use in a photolithographic composition without the need for an additional polymer binder. That is, the polymerized structures would act as the polymer binder as well as the light absorbing compound. The structures of Formulas I–XI can by polymerized in a linear fashion by creating non-conjugated, non-aromatic linkages between two of the functional groups as shown in the table below.

| Formula | Linkages Between: |
|---|---|
| I | $R_1$—$R_1$; $R_1$—$R_2$; $R_1$-EWG; and $R_2$-EWG |
| II | $R_1$-EDG; $R_1$-EWG; $R_1$—$R_2$; EDG-EWG; $R_2$-EDG; and $R_2$-EWG |
| III | $R_1$—$R_1$; $R_1$—$R_2$; $R_1$-EWG; and $R_2$-EWG |
| IV | $R_1$—$R_1$; $R_1$-EWG; and EWG-EWG |
| V | $R_1$-EDG; $R_1$-EWG; $R_1$—$R_2$; EDG-EWG; $R_2$-EWG; and $R_2$-EWG |
| VI | $R_1'$—$R_2''$ and $R_1'$—$R_1''$ |
| VII | $R_1'$—$R_2''$; $R_1'$—$R_1''$; $R_1'$-EDG''; $R_2'$-EDG''; and EDG'-EDG'' |
| VIII | $R_1'$—$R_2''$; $R_1'$—$R_1''$; $R_1'$-EWG''; $R_2'$-EWG''; and EWG'-EWG'' |

Where (') refers to the first unit of the dimer dye, and ('') refers to the second unit of a dimer dye.

Linkage units could be utilized between the structures to form the above-described linkages. Suitable linkage units include a moiety selected from the group consisting of alkyls, acyclic heteroalkyls, non-aromatic cyclic alkyls, and non-aromatic cyclic heteroalkyls.

As indicated previously, the light attenuating compound can be attached to the polymer binder backbone or to a functional group or linkage unit which is, in turn, attached to the polymer backbone. In another embodiment, at least one of $R_1$ and $R_2$ of the above-described light attenuating compounds is attached to a polymer binder (either directly to the backbone or via a linkage unit). Structures E and F below illustrate these attachments. In structure E, a 365 nm dienyl dye having an amino electron-donating group is bonded to a polymer binder via a hydroxypropyl linking group. The dye is attached by a carboxylic ester electron-withdrawing group. In structure F, the amino electron-donating group is functionalized with two hydroxyethyl substituents which are reacted with a diisocyanate to form a polyurethane backbone.

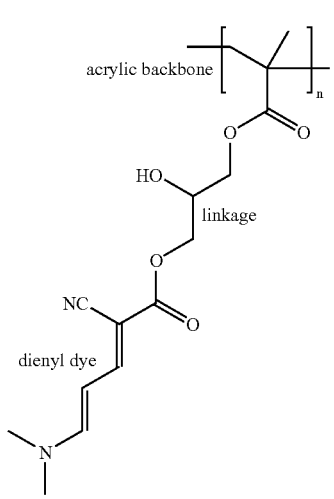

Structure E

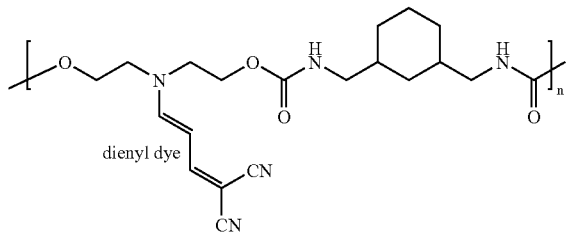

Structure F

When used in reference to Formulas I–XI, the term "compounds" is intended to refer to the actual compound represented in the particular Formula, as well as all functional olefinic and/or diolefinic moieties thereof. For example, the "compound of structure A of Formula I," refers to the structure A shown in Formula I above as well as the structure:

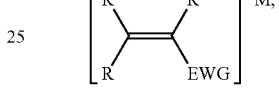

where "M" is a compound to which R' is bonded. Thus, "compound of structure A of Formula I" would include those moieties where any of the constituents (i.e., any of the R groups or the EWG) are bonded to another compound.

Also, as used herein, "cyclic" is intended to refer to any group, compound, or moiety which includes a cyclic group as part of its structure. Thus, cyclic would include groups such as methylenecyclohexyl (—$CH_2$—$C_6H_5$) and ethylenecyclohexyl.

The following table sets forth preferred compounds which fall into the classes described above with respect to Formulas I–XIII.

| Class | Preferred Sunstituents |
|---|---|
| Acyclic Alkyls | methyl, ethyl, propyl, and isopropyl |
| Cyclic Alkyls | cyclopentyl and cyclohexyl |
| Acyclic Heteroalkyls | methoxyethyl, ethoxyethyl, methoxypropyl, chloroethyl, and 1,1,1-trifluoroethyl |
| Cyclic Heteroalkyls | tetrahydrofurfuryl, methylenecyclohexyl (—$CH_2$—$C_6H_5$), and ethylenecyclohexyl |
| EWG's Having Carbonyl Groups | —CO—$CH_3$, —CO—$CH_2CH_3$, and —CO—$CH_2(CH_3)_2$ |
| EWG's Having Carboxyl Groups | —CO—O—$CH_3$, —CO—O—$CH_2CH_3$, and —CO—O—$CH_2$—CH(OH)—$CH_2$—O— |
| EWG's Having Carboxamido Groups | —CO—NH—$CH_2$—$CH_2$—OH and —CO—NH—$CH_2$—$CH_2$—O— |
| EWG's Having Sulfonyl Groups | —$SO_2$—$CH_3$ and —$SO_2CH_2CH_3$ |
| EDG's Having an Alkoxy Group | $H_3C$—O—, $H_3CCH_2$—O—, —$CH_2CH_2$—O—, and $R_1$—O—, wherein $R_1$ is non-aromatic and may individually be hydrogen, or an acyclic (preferably $C_1$–$C_4$ branched or unbranched) or cyclic (preferably $C_5$–$C_6$) alkyl or heteroalkyl |

-continued

| Class | Preferred Sunstituents |
|---|---|
| EDG's Having an $R_xR_yN$ Group | $(H_3C)_2N—$, $(H_3CCH_2)_2N—$, $(—O—CH_2CH_2)_2N—$, and |
| | $(H_3C)_2N—$, $(H_3CCH_2)_2N—$, $(—O—CH_2CH_2)_2N—$, and  |

EXAMPLE

The following example sets forth preferred methods in accordance with the invention. It is to be understood, however, that this example is provided by way of illustration and nothing therein should be taken as a limitation upon the overall scope of the invention.

Poly(glycidyl methacrylate) was reacted with 2,4-hexadienoic acid (a non-aromatic, deep ultraviolet chromophore) at 100–110° C. for 24 hours with a benzyltriethylammonium chloride catalyst to form a solution of the dye-attached binder shown in Scheme A.

Scheme A 2,4-Hexadienoic Acid Attached to Poly(glycidyl methacrylate)

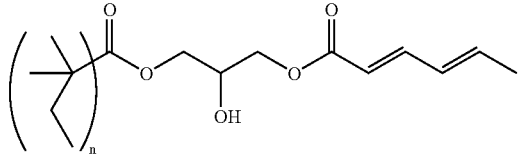

The resulting polymer binder was combined in solution (with 1-methoxy-2-propanol and ethyl lactate as the solvents) with a glycouril-formaldehyde cross-linking agent and an acid catalyst (p-toluenesulfonic acid) to form a BARC composition. The concentrations of the various compounds utilized in the composition were as follows:

| Compounds | Parts by Weight[a] |
|---|---|
| Polymer Solution | 14.52 |
| Cross-Linking Agent | 0.66 |
| p-toluenesulfonic acid | 0.06 |
| 1-methoxy-2-propanol | 42.38 |
| ethyl lactate | 42.38 |

[a]Parts by weight based upon the total weight of all compounds taken as 100% by weight The composition was spin coated onto a silicon wafer at 1500 rpm for 60 seconds followed by a hotplate bake at 175° C. for 60 seconds to form a BARC layer with a film optical density at 248 nm of 4.83/micron. The coating was then plasma etched in a commercial wafer etching tool using a mixture of HBr and $O_2$ as the etchant gas. The etch rate of the coating was 5815 Å/minute.

For comparison purposes, the etch rate of a BARC composition (DUV-42 for use in 248 nm photolithographic processes, available from Brewer Science, Inc., Rolla, Mo.) was determined. The binder in DUV-42 is a copolymer of glycidyl methacrylate and 2-hydroxypropyl methacrylate in which the glycidyl groups have been reacted with 9-anthracenecarboxylic acid (9-ACA) to form a dye-attached binder with high light absorbency at 248 nm. The DUV-42 was applied to a silicon wafer and processed following the procedures set forth above with respect to the inventive composition. The etch rate of the DUV-42 was 3218 Å/minute. Thus, the composition utilizing a light attenuating compound according to the invention etched 1.8 times faster than the prior art product. The comparatively low plasma etch rate of the DUV-42 was a result of the high aromatic ring content of the 9-ACA.

We claim:

1. In a composition for use during microlithographic processes, said composition comprising a polymer binder dissolved in a solvent system, the improvement which comprises a non-aromatic, light attenuating compound comprising a moiety selected from the group consisting of:

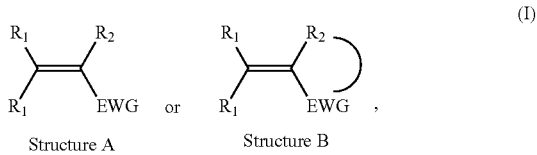

(I)

Structure A    or    Structure B where:
each $R_1$ is non-aromatic and is individually hydrogen, or an acyclic or cyclic alkyl or heteroalkyl;
in structure A, where EWG and $R_2$ do not form a cyclic unit:
EWG is a non-aromatic electron-withdrawing group; and
$R_2$ is non-aromatic and is hydrogen, an a cyclic or cyclic alkyl or heteroalkyl, or an electron-withdrawing group; and
in structure B, where EWG and $R_2$ form a cyclic electron-withdrawing unit, the cyclic unit comprises a C=O, C=S, or a C=N at a first carbon atom, and: a C=O or a C=N attached to a carbon atom at least two carbon atoms away from the first carbon atom; or an O, S, or N as a member of the ring at least two positions away from the first carbon atom;

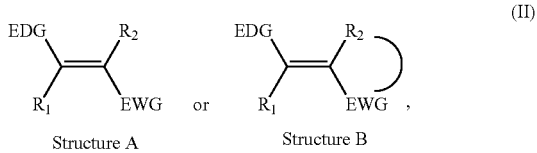

(II)

Structure A    or    Structure B where:
  $R_1$ is non-aromatic and is individually hydrogen, or an acyclic or cyclic alkyl or heteroalkyl;
  EDG is an electron-donating group;
  in structure A, where EWG and $R_2$ do not form a cyclic unit:
    EWG is a non-aromatic electron-withdrawing group; and
    $R_2$ is non-aromatic and is hydrogen, an acyclic or cyclic alkyl or heteroalkyl, or an electron-withdrawing group; and
  in structure B, where EWG and $R_2$ form a cyclic electron-withdrawing unit, the cyclic unit comprises a C=O, C=S, or a C=N at a first carbon atom, and:
    a C=O or a C=N attached to a carbon atom at least two carbon atoms away from the first carbon atom; or an O, S, or N as a member of the ring at least two positions away from the first carbon atom;

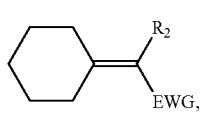

(X)

where: $R_2$ is non-aromatic and is individually an acyclic or cyclic alkyl or heteroalkyl, or an electron-withdrawing group; and EWG is a non-aromatic electron-withdrawing group;

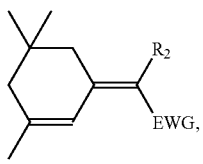

(XI)

where: $R_2$ is non-aromatic and is individually an acyclic or cyclic alkyl or heteroalkyl, or an electron-withdrawing group; and EWG is a non-aromatic electron-withdrawing group; and mixtures thereof,
wherein said polymer binder comprises a backbone, and at least one of $R_1$ and $R_2$ of said light attenuating compound is bonded to the polymer binder backbone.

2. In a composition for use during microlithographic processes, said composition comprising a polymer binder dissolved in a solvent system, the improvement which comprises a non-aromatic, light attenuating compound comprising a moiety of

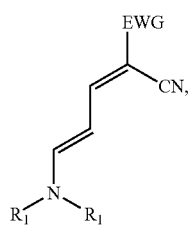

where EWG is a non-aromatic electron-withdrawing group selected from the group consisting of iminos, carboxylic acids, carboxylic esters, carboximido, and sulfonyls groups; and
each R1 is individually selected from the group consisting of hydrogen and alkyls, wherein said polymer binder comprises a backbone, and EWG is bonded to said backbone.

3. In a curable composition for use during microlithographic processes, said composition comprising a polymer binder dissolved in a solvent system, the improvement which comprises a non-aromatic, light attenuating compound which is bonded to the polymer binder and absorbs light at wavelengths of less than about 300 nm in said composition, said light attenuating compound comprising:
  carbon atoms $C_1$ and $C_2$ double-bonded to one another and carbon atoms $C_3$ and $C_4$ double-bonded to one another and wherein $C_3$ is bonded to $C_2$ so as to form conjugated double bonds;
  an EWG bonded to carbon atom $C_1$; and
  an EDG bonded to carbon atom $C_4$, said EDG including a moiety selected from the group consisting of $H_3CO$, OH, and $R_1$—O—, wherein $R_1$ is non-aromatic and is selected from the group consisting of hydrogen, acyclic and cyclic alkyls, and heteroalkyls.

4. The composition of claim 3, wherein the polymer binder comprises a backbone, and said light attenuating compound is bonded to said backbone.

5. The composition of claim 3, wherein said light attenuating compound is bonded to a linkage unit and said linkage unit is bonded to the polymer binder.

6. The composition of claim 5, wherein said linkage unit comprises a moiety selected from the group consisting of cyclic alkyls, acyclic alkyls, acyclic heteroalkyls, and cyclic heteroalkyls.

7. In a composition for use during microlithographic processes, said composition comprising a polymer binder dissolved in a solvent system, the improvement which comprises a non-aromatic, light attenuating compound comprising a moiety selected from the group consisting of:

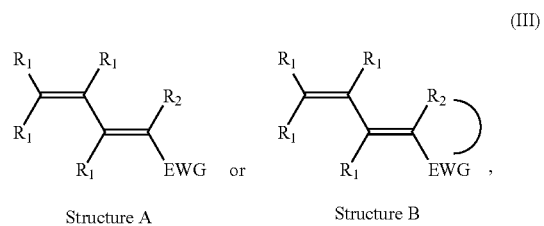

(III)

Structure A     or     Structure B where:
  each $R_1$ is non-aromatic and is individually selected from the group consisting of cyclic alkyls and acyclic alkyls;
  in structure A, where EWG and $R_2$ do not form a cyclic unit:
    EWG is a non-aromatic electron-withdrawing group; and
    $R_2$ is non-aromatic and is individually selected from the group consisting of cyclic alkyls and acyclic alkyls;
  in structure B, where EWG and $R_2$ form a cyclic electron-withdrawing unit, the cyclic unit comprises a C=O, C=S, or a C=N at a first carbon atom, and:
    a C=O or a C=N attached to a carbon atom at least two carbon atoms away from the first carbon atom; or an O, S, or N as a member of the ring at least two positions away from the first carbon atom;

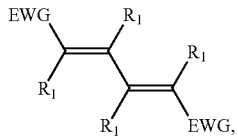

where:
each $R_1$ is non-aromatic and is individually selected from the group consisting of cyclic alkyls and acyclic alkyls; and
EWG is a non-aromatic electron-withdrawing group;

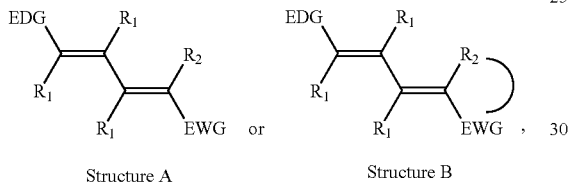

where:
each $R_1$ is non-aromatic and is individually selected from the group consisting of cyclic alkyls and acyclic alkyls;
EDG is an electron-donating group;
in structure A, where EWG and $R_2$ do not form a cyclic unit:
EWG is a non-aromatic electron-withdrawing group other than cyano groups, and $R_2$ is non-aromatic and is individually selected from the group consisting of cyclic alkyls and acyclic alkyls; or
EWG is a cyano group, and $R_2$ is non-aromatic and is individually selected from the group consisting of cyclic alkyis and acyclic alkyls; and
in structure B, where EWG and $R_2$ form a cyclic electron-withdrawing unit, the cyclic unit comprises a C=O, C=S, or a C=N at a first carbon atom, and: a C=O or a C=N attached to a carbon atom at least two carbon atoms away from the first carbon atom; or an O, S, or N as a member of the ring at least two positions away from the first carbon atom; and mixtures thereof, wherein at least one of $R_1$ and $R_2$ of said light attenuating compound is bonded to the polymer binder.

8. In a composition for use during microlithographic processes, said composition comprising a polymer binder dissolved in a solvent system, the improvement which comprises a non-aromatic, light attenuating compound comprising a moiety selected from the group consisting of:

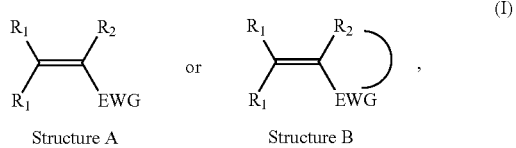

where:
each $R_1$ is non-aromatic and is individually hydrogen, or an acyclic or cyclic alkyl or heteroalkyl;
in structure A, where EWG and $R_2$ do not form a cyclic unit:
EWG is a non-aromatic electron-withdrawing group; and
$R_2$ is non-aromatic and is hydrogen, an acyclic or cyclic alkyl or heteroalkyl, or an electron-withdrawing group; and
in structure B, where EWG and $R_2$ form a cyclic electron-withdrawing unit, the cyclic unit comprises a C=O, C=S, or a C=N at a first carbon atom, and: a C=O or a C=N attached to a carbon atom at least two carbon atoms away from the first carbon atom; or an O, S, or N as a member of the ring at least two positions away from the first carbon atom;

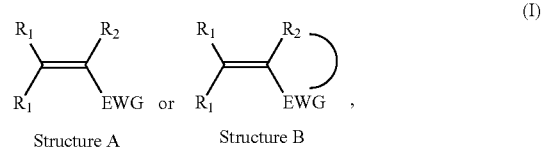

where:
$R_1$ is non-aromatic and is individually hydrogen, or an acyclic or cyclic alkyl or heteroalkyl;
EDG is an electron-donating group;
in structure A, where EWG and $R_2$ do not form a cyclic unit:
EWG is a non-aromatic electron-withdrawing group; and
$R_2$ is non-aromatic and is hydrogen, an acyclic or cyclic alkyl or heteroalkyl, or an electron-withdrawing group; and
in structure B, where EWG and $R_2$ form a cyclic electron-withdrawing unit, the cyclic unit comprises a C=O, C=S, or a C=N at a first carbon atom, and: a C=O or a C=N attached to a carbon atom at least two carbon atoms away from the first carbon atom; or an O, S, or N as a member of the ring at least two positions away from the first carbon atom;

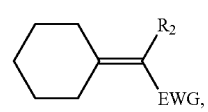

where: $R_2$ is non-aromatic and is individually an acyclic or cyclic alkyl or heteroalkyl, or an electron-withdrawing group; and EWG is a non-aromatic electron-withdrawing group;

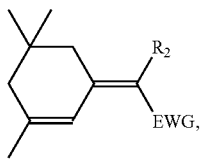 (XI)

where: $R_2$ is non-aromatic and is individually an acyclic or cyclic alkyl or heteroalkyl, or an electron-withdrawing group; and EWG is a non-aromatic electron-withdrawing group; and mixtures thereof, wherein at least one of $R_1$ and $R_2$ of said light attenuating compound is bonded to a linkage unit and said linkage unit is bonded to the polymer binder.

9. The composition of claim 8, wherein said linkage unit comprises a moiety selected from the group consisting of cyclic alkyls, acyclic alkyls, acyclic heteroalkyls, and cyclic heteroalkyls.

* * * * *